(12) United States Patent
Itoh et al.

(10) Patent No.: US 7,230,272 B2
(45) Date of Patent: Jun. 12, 2007

(54) ACTIVE MATRIX SUBSTRATE AND DISPLAY DEVICE

(75) Inventors: Ryoki Itoh, Taki-gun (JP); Yuhko Hashimoto, Matsusaka (JP); Kenji Enda, Suzuka (JP); Masanori Takeuchi, Tsu (JP)

(73) Assignee: Sharp Kabushiki Kaisha, Osaka (JP)

( * ) Notice: Subject to any disclaimer, the term of this patent is extended or adjusted under 35 U.S.C. 154(b) by 121 days.

(21) Appl. No.: 11/114,020

(22) Filed: Apr. 26, 2005

(65) Prior Publication Data

US 2005/0236615 A1 Oct. 27, 2005

(30) Foreign Application Priority Data

Apr. 27, 2004 (JP) .............................. 2004-131280

(51) Int. Cl.
*H01L 29/41* (2006.01)
*H01L 31/0224* (2006.01)
(52) U.S. Cl. .................... 257/72; 257/59; 257/443; 257/457; 345/43; 345/92
(58) Field of Classification Search ................. 257/40, 257/59, 72; 345/43
See application file for complete search history.

(56) References Cited

U.S. PATENT DOCUMENTS

2004/0031964 A1* 2/2004 Morita et al. ................. 257/59

FOREIGN PATENT DOCUMENTS

JP 4-195024 7/1992

* cited by examiner

*Primary Examiner*—Andy Huynh
*Assistant Examiner*—Earl N. Taylor
(74) *Attorney, Agent, or Firm*—Nixon & Vanderhye P.C.

(57) ABSTRACT

An active matrix substrate of the present invention includes a TFT and a substrate. The TFT formed on a substrate includes, when viewed in a normal direction of the substrate: a first region in which a gate electrode overlaps a source electrode via a semiconductor layer; a second region in which the gate electrode overlaps a drain electrode via the semiconductor layer; and a third region in which the semiconductor layer overlaps neither the gate electrode, source electrode, nor the drain electrode. The third region includes a portion adjoining the source electrode lying outside the first region and/or a portion adjoining the drain electrode lying outside the second region. The gate electrode includes: a main body, which includes a portion constituting the first region and the second region; and a protrusion from the main body. At least a part of the protrusion of the gate electrode is in between the drain electrode and the portion of the third region adjoining the source electrode, or between the source electrode and the portion of the third region adjoining the drain electrode.

16 Claims, 10 Drawing Sheets

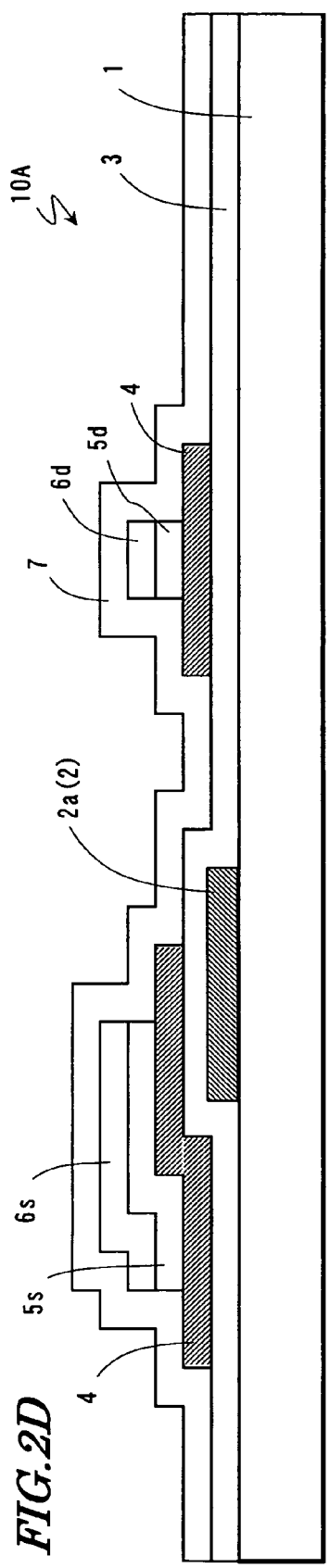
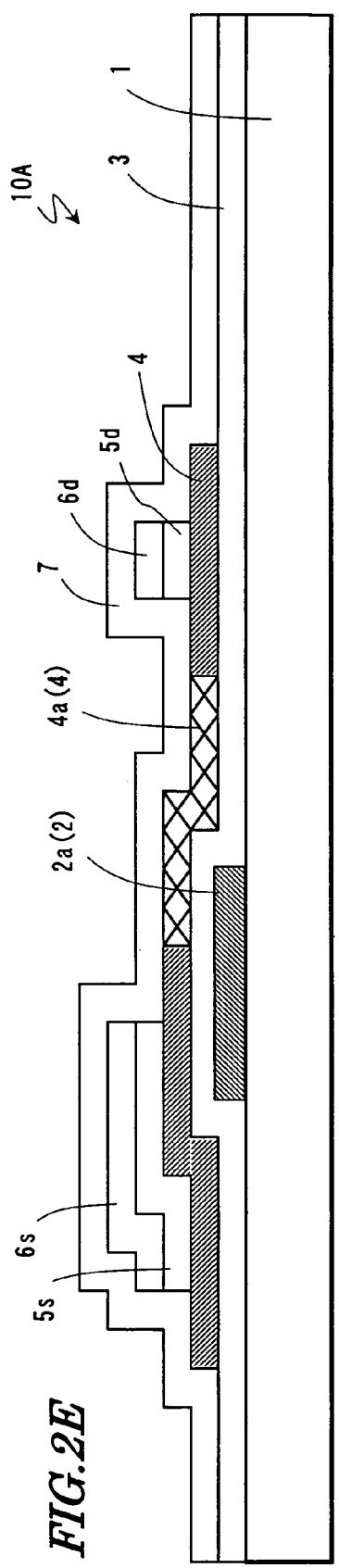

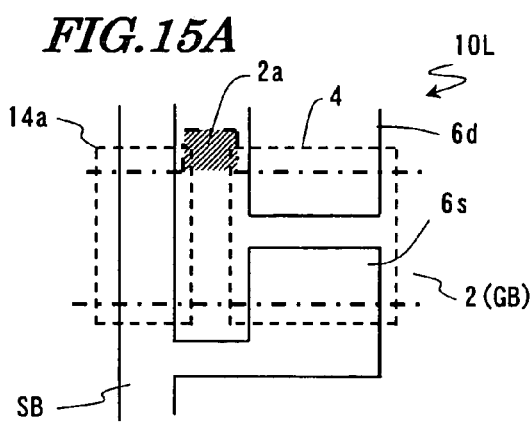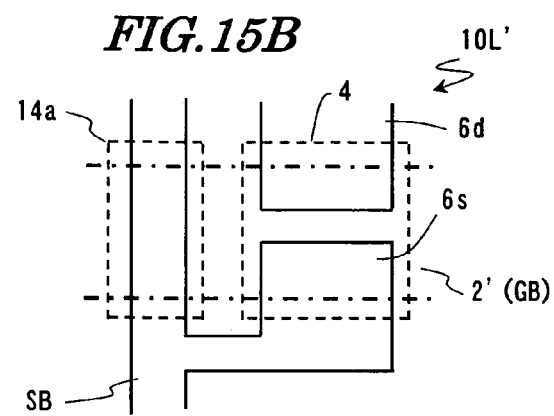

ACTIVE MATRIX SUBSTRATE AND DISPLAY DEVICE

BACKGROUND OF THE INVENTION

1. Field of the Invention

The present invention relates to an active matrix substrate composed of a substrate having transistors formed thereon, and more particularly to an active matrix substrate to be suitably used for a display device.

2. Description of the Related Art

Currently, display devices such as liquid crystal display devices and organic EL display devices incorporating active matrix substrates are in wide use.

As active matrix substrates, those employing thin film transistors (TFTs) as active elements are mainly used (hereinafter referred to as "TFT substrates"). With the improvement in display quality in recent years, further optimization of TFT structures is being studied.

For example, Japanese Laid-Open Patent Publication No. 2002-190605 discloses a structure for suppressing fluctuations in the parasitic capacitance of a TFT. In FIG. 3 of Japanese Laid-Open Patent Publication No. 2002-190605, for example, there is described a TFT including a semiconductor layer which partially spreads outside a gate electrode. This TFT is structured so that, within the region of the semiconductor layer spreading outside, a portion which is located over a source electrode and a portion which is located over a drain electrode are shielded by a gate electrode.

However, the inventors have conducted a study to find that the aforementioned conventional structure has a problem in that the display quality is likely to be affected by the precision of the patterning which the semiconductor layer is subjected to. The reason behind this is that, as will be specifically described later with reference to comparative examples, within the region of the semiconductor layer spreading outside the gate electrode, a portion which is located over a source electrode and a portion which is located over a drain electrode are connected via a semiconductor layer whose potential is not controlled by the gate electrode, thus allowing a leak current to occur between the source electrode and the drain electrode.

Moreover, in a structure where a semiconductor layer is formed so as to overlay a gate insulating layer at an intersection between a source bus line and a gate bus line, this being in order to prevent short-circuiting between the source bus line and the gate bus line, an unwanted residual semiconductor film may be left, possibly causing a leak current associated with the residual semiconductor film. Such a leak current also degrades display quality.

SUMMARY OF THE INVENTION

In order to overcome the problems described above, preferred embodiments of the present invention provide an active matrix substrate which prevents display quality from being substantially affected by the patterning precision for a semiconductor layer thereof.

An active matrix substrate according to the present invention is an active matrix substrate comprising a substrate and a transistor formed on the substrate, the transistor including a gate electrode, a gate insulating layer covering the gate electrode, a semiconductor layer formed on the gate insulating layer, and a source electrode and a drain electrode formed on the semiconductor layer, wherein, when viewed from a normal direction of the substrate, the active matrix substrate includes: a first region in which the gate electrode overlaps the source electrode via the semiconductor layer; a second region in which the gate electrode overlaps the drain electrode via the semiconductor layer; and a third region in which the semiconductor layer overlaps neither the gate electrode, the source electrode, nor the drain electrode, the third region including a portion adjoining a portion of the source electrode lying outside the first region and/or a portion adjoining a portion of the drain electrode lying outside the second region; the gate electrode includes: a main body, which includes portions constituting the first region and the second region; and a protrusion from the main body; and at least a part of the protrusion of the gate electrode is in between the drain electrode and the portion of the third region adjoining the source electrode, or between the source electrode and the portion of the third region adjoining the drain electrode.

In one embodiment, the active matrix substrate further includes a fourth region in which the gate electrode overlaps the semiconductor layer but overlaps neither the source electrode nor the drain electrode, the fourth region being formed between the drain electrode and the portion of the third region adjoining the source electrode, or between the source electrode and the portion of the third region adjoining the drain electrode; and a portion of the gate electrode constituting the fourth region includes at least a part of the protrusion.

In one embodiment, the active matrix substrate further includes a fifth region in which the gate electrode overlaps neither the semiconductor layer, the source electrode, nor the drain electrode, the fifth region being formed between the drain electrode and the portion of the third region adjoining the source electrode, or between the source electrode and the portion of the third region adjoining the drain electrode. In the case where a fourth region is formed, the fifth region is formed so as to adjoin the fourth region.

In one embodiment, a portion of the gate electrode constituting the fifth region includes at least a part of the protrusion.

In one embodiment, the semiconductor layer has a recess or a recessed corner, and the protrusion of the gate electrode has an overlap with the recess or recessed corner of the semiconductor layer.

In one embodiment, the active matrix substrate further comprises a gate bus line formed on the substrate, wherein the main body of the gate electrode is formed as a branch extending from the gate bus line.

In one embodiment, the active matrix substrate further comprises a gate bus line formed on the substrate, wherein the main body of the gate electrode lies in a part of the gate bus line. The width of the main body may be equal to, or narrower or wider than, the width of the gate bus line.

In one embodiment, the semiconductor layer has at least two sides which are substantially parallel to a direction in which the gate bus line extends, the at least two sides being disposed so as to overlap the gate electrode and the gate bus line only at the protrusion of the gate electrode. In other words, the at least two sides overlap neither the gate electrode nor the gate bus line in any region other than the protrusion of the gate electrode. In an alternative structure, only one of the at least two sides overlaps the protrusion, while the other side overlaps neither the gate electrode nor the gate bus line.

In one embodiment, the active matrix substrate comprises a further electrode formed from a same conductive film as that composing the source electrode and the drain electrode, wherein, when viewed from a normal direction of the substrate, the active matrix substrate includes a further second region in which the gate electrode overlaps the further electrode via the semiconductor layer; the gate electrode has a further main body including a portion constituting the second region and the further second region; and at least a part of the further protrusion of the further electrode is in between the portion of the third region adjoining the drain electrode and a portion of the further electrode lying outside the further second region.

In one embodiment, the active matrix substrate includes a further fourth region in which the gate electrode overlaps the semiconductor layer but does not overlap the further electrode, the further fourth region being formed between the portion of the third region adjoining the drain electrode and the portion of the further electrode lying outside the further second region; and a portion of the gate electrode constituting the further fourth region includes at least a part of the further protrusion.

In one embodiment, the active matrix substrate further comprises a source bus line connected to the source electrode, wherein the semiconductor layer overlaps at least a part of the source bus line.

Alternatively, an active matrix substrate according to the present invention is an active matrix substrate comprising a substrate and a transistor formed on the substrate, the transistor including a gate electrode, a gate insulating layer covering the gate electrode, a semiconductor layer formed on the gate insulating layer, a source electrode and a drain electrode formed on the semiconductor layer, a gate bus line formed integrally with the gate electrode, and a source bus line connected to the source electrode, the gate bus line being covered by the gate insulating film, further comprising a further semiconductor layer formed in a region including an intersection between the gate bus line and the source bus line, the further semiconductor layer being interposed between the source bus line and the gate insulating layer, wherein, when viewed from a normal direction of the substrate, the active matrix substrate includes: a first region in which the gate electrode overlaps the source electrode via the semiconductor layer; a second region in which the gate electrode overlaps the drain electrode via the semiconductor layer; a third region in which the semiconductor layer overlaps neither the gate electrode, the source electrode, nor the drain electrode, the third region including a portion adjoining a portion of the source electrode lying outside the first region and/or a portion adjoining a portion of the drain electrode lying outside the second region; and a fourth region in which the further semiconductor layer overlaps neither the gate bus line nor the source bus line; the gate electrode and/or the gate bus line has a protrusion protruding in a direction perpendicular to a direction in which the gate bus line extends; and at least a part of the protrusion of the gate electrode is in between the fourth region and a portion of the drain electrode lying outside the second region.

In one embodiment, the active matrix substrate further includes a fifth region in which the gate electrode and/or the gate bus line overlaps the semiconductor layer and/or the further semiconductor layer but overlaps neither the source electrode nor the drain electrode, the fifth region being formed between the fourth region and the portion of the drain electrode lying outside the second region; and a portion of the gate electrode and/or the gate bus line constituting the fifth region includes at least a part of the protrusion.

A display device according to the present invention comprises any of the aforementioned active matrix substrates.

In a transistor comprised in the active matrix substrate of the present invention, a protrusion is provided for a gate electrode (and/or a gate bus line) to ensure that a gate voltage can be applied to a part or a whole of a region in which a residual semiconductor film may occur. Even if a residual film is left after a process of patterning a semiconductor layer in the production process of a transistor which has a region in which the semiconductor layer overlaps neither the gate electrode, the source electrode, nor the drain electrode, a gate voltage is applied to a semiconductor layer (including a residual film portion) which is present between the source electrode and the drain electrode and thus controls carriers in the semiconductor layer, whereby the leak current can be reduced. Note that the period during which the scanning signal supplied to the gate electrode is at a High level, i.e., the period during which the semiconductor layer is in a conducting state, is extremely short; for most of the time, the scanning signal is at a Low level (off state), i.e., the semiconductor layer is in a non-conducting state. A residual semiconductor film is likely to occur in the case where a recess or a recessed corner is provided in the semiconductor layer for the purpose of reducing the overlapping area between the gate electrode and the semiconductor layer, for example. Therefore, the present invention provides a particularly outstanding advantage in the case where the semiconductor layer has a recess or a recessed corner.

In a structure where a semiconductor layer (overlying a gate insulating layer) is formed at an intersection between a source bus line and a gate bus line for the purpose of preventing short-circuiting between the source bus line and the gate bus line, even if a residual semiconductor film exists which causes the portion of the semiconductor layer under the drain electrode to be connected to the portion of the semiconductor layer at the aforementioned intersection, the protrusion provided in the gate electrode and/or the gate bus line reduces the leak current due to such a residual semiconductor film.

Thus, according to the present invention, there is provided an active matrix substrate which, when a display device is constructed by using the active matrix substrate, prevents display quality from being substantially affected by the patterning precision for a semiconductor layer thereof. For example, when a liquid crystal display device is constructed by using the active matrix substrate of the present invention, the charging rate or voltage retention rate of the pixels (pixel capacitances) can be improved. Therefore, according to the present invention, a decrease in the yield due to fluctuations in the production process can be suppressed, or diversifications in the display characteristics within the display panel surface can be suppressed.

Other features, elements, processes, steps, characteristics and advantages of the present invention will become more apparent from the following detailed description of preferred embodiments of the present invention with reference to the attached drawings.

BRIEF DESCRIPTION OF THE DRAWINGS

FIGS. 2A, 2B, 2C, and 2D are schematic cross-sectional views taken along lines A–A', B–B', C–C', and D–D' in FIG. 1A. FIG. 2E is a schematic cross-sectional view taken along line D–D', with respect to the case where a residual semiconductor film exists in the TFT 1A1.

FIG. 15A is a plan view schematically showing the structure of TFT 10L according to an example of the second embodiment; and FIG. 15B is a plan view schematically showing the structure of a TFT 10L' of a comparative example.

DETAILED DESCRIPTION OF PREFERRED EMBODIMENTS

Figure 1A:
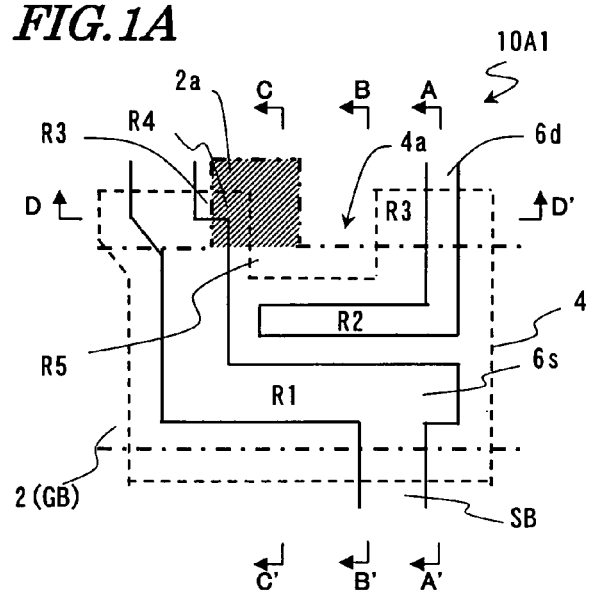
FIG. 1A is a plan view schematically showing the structure of a TFT 10A1 included in a TFT substrate of Example 1.

Hereinafter, active matrix substrate structures according to embodiments of the present invention will be described with reference to the accompanying drawings. The active matrix substrate of the present invention can be produced by known production methods, and hence the descriptions of such methods are omitted. In the accompanying drawings, any constituent elements which serve substantially the same function are denoted by the same reference numeral.

(First Embodiment)

An active matrix substrate according to the first embodiment of the present invention includes transistors (e.g., TFTs) formed on a substrate (e.g., a glass substrate). When viewed in a normal direction of the substrate, each transistor includes: a first region in which a gate electrode overlaps a source electrode via a semiconductor layer (which is a semiconductor layer including a channel region); a second region in which the gate electrode overlaps a drain electrode via the semiconductor layer; and a third region in which the semiconductor layer overlaps neither the gate electrode, the source electrode, nor the drain electrode. The third region includes portions adjoining a portion of the source electrode lying outside the first region and/or portions adjoining a portion of the drain electrode lying outside the second region. The gate electrode includes: a main body, which includes portions constituting the first region and the second region; and a protrusion from the main body. At least a part of the protrusion of the gate electrode is in between the drain electrode and a portion of the third region adjoining the source electrode (as exemplified in FIG. 1A, for example), or between the source electrode and a portion of the third region adjoining the drain electrode.

Hereinafter, specific structures of the TFT substrate of the first embodiment as well as each TFT formed thereon will be illustrated by way of Examples and in comparison with Comparative Examples. First, referring to FIGS. 1 to 3 and FIG. 4, the structures of the TFT substrate of Example 1 as well as each TFT formed thereon will be described.

Figure 1B:
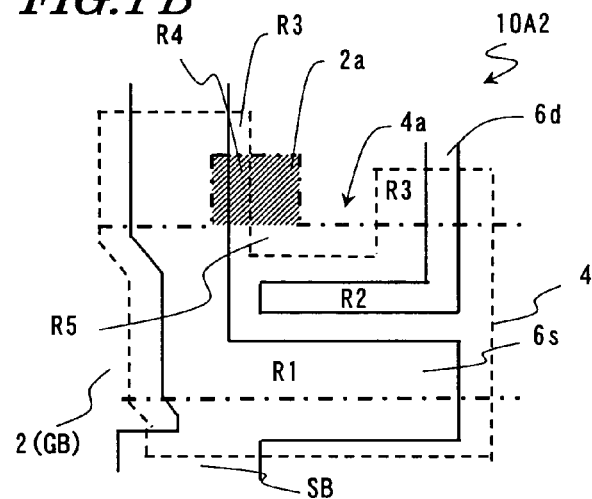
FIG. 1B is a plan view schematically showing the structure of a TFT 10A2 as a variant of Example 1.
Figure 1C:
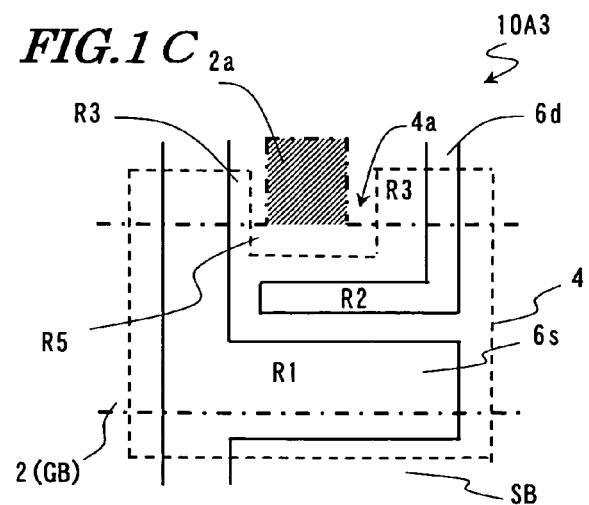
FIG. 1C is a plan view schematically showing the structure of a TFT 10A3 as another variant of Example 1.
Figure 1D:
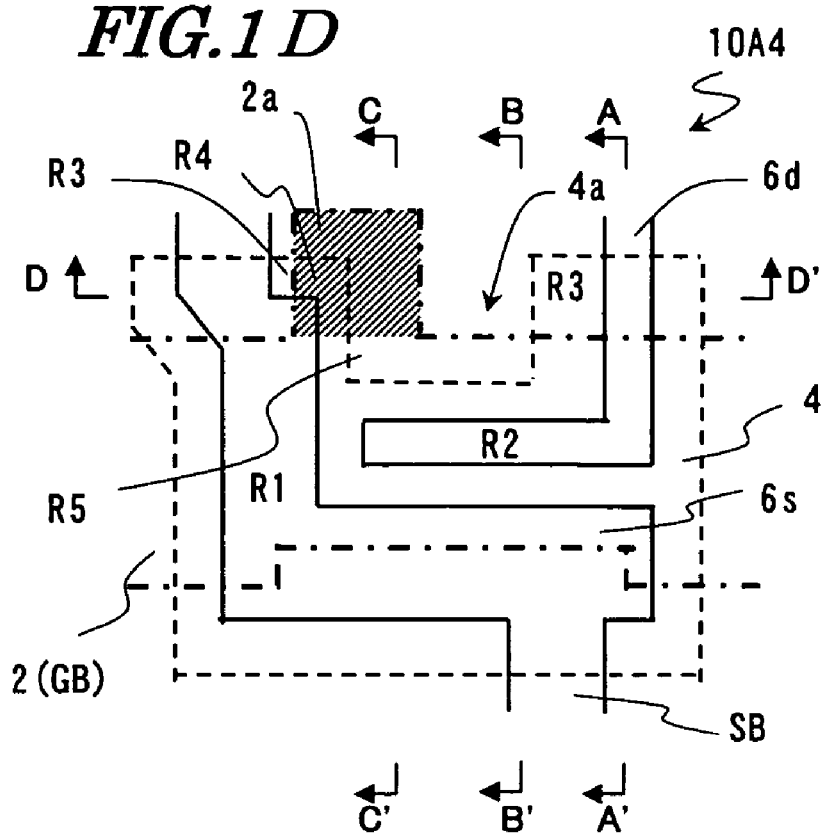
FIG. 1D is a plan view schematically showing the structure of a TFT 10A4 as still another variant of Example 1.
Figure 1E:
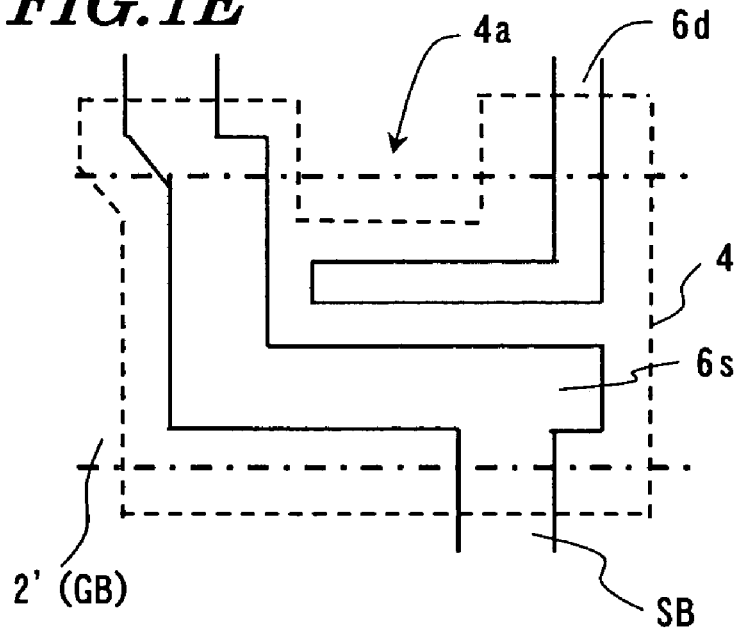
FIG. 1E is a plan view schematically showing the structure of a TFT 10A' included in a TFT substrate of Comparative Example 1.
Figure 2A:
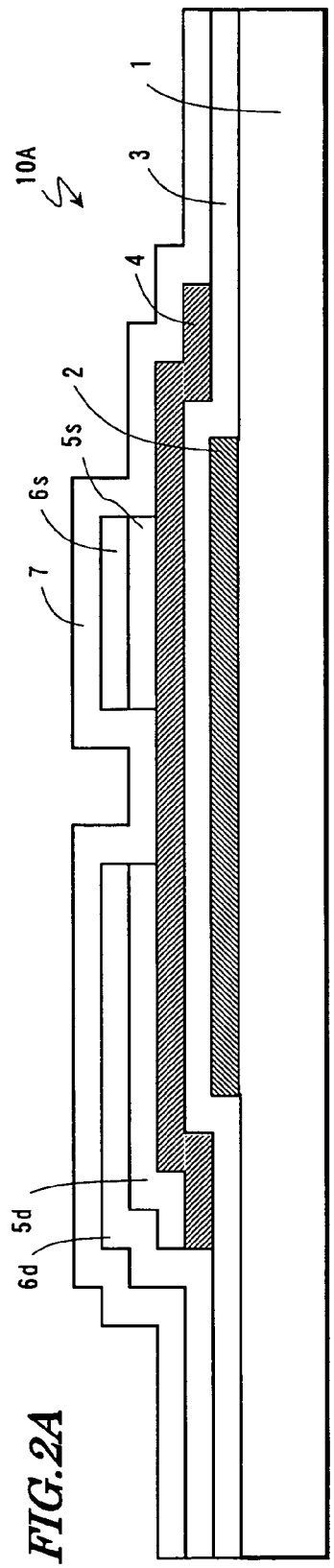
Figure 2B:
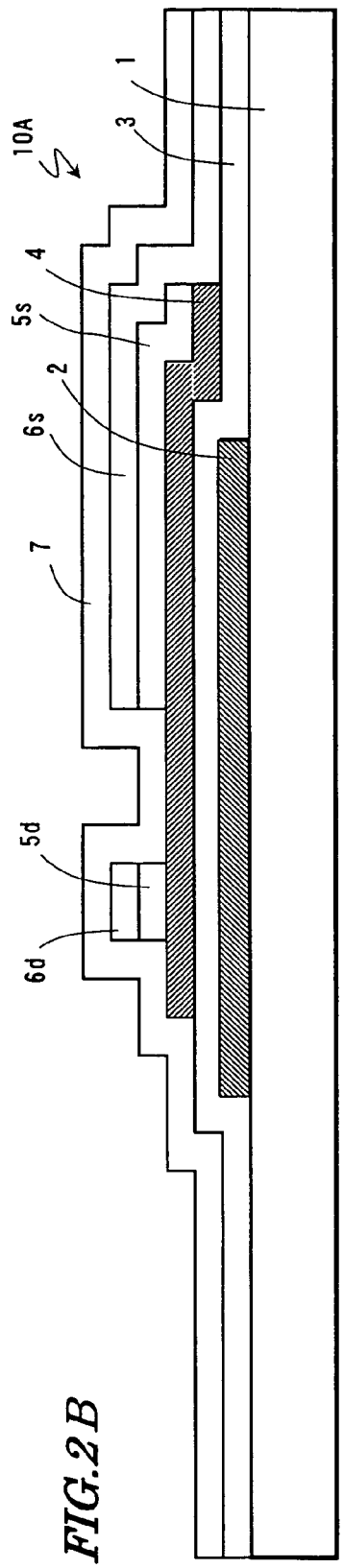
Figure 2C:
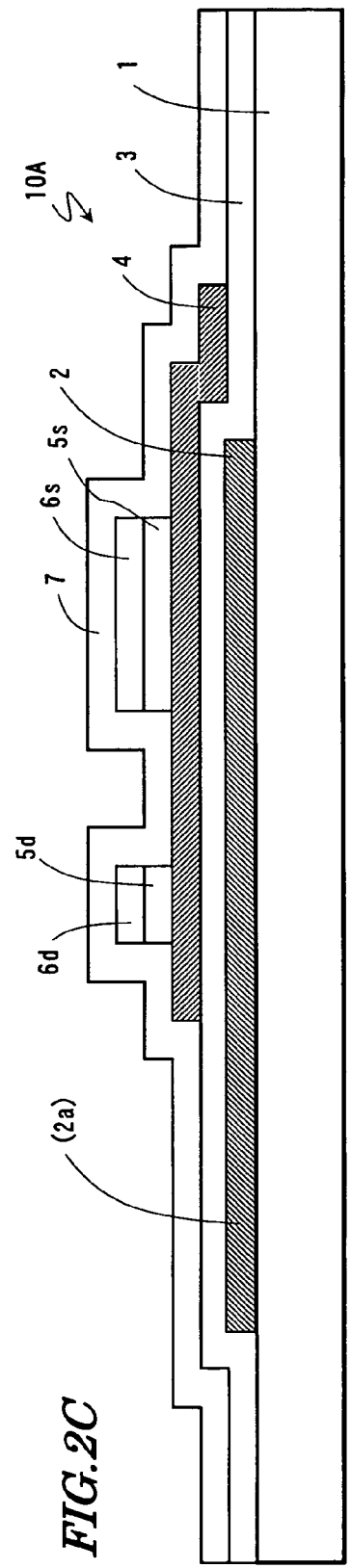
Figure 3:
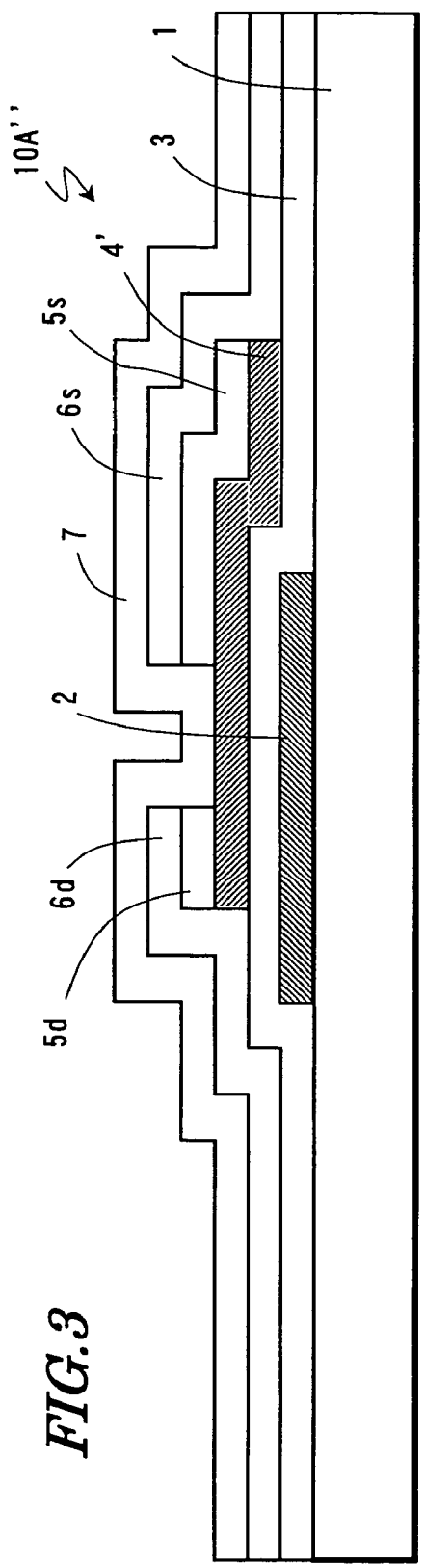
FIG. 3 is a schematic cross-sectional view showing a TFT 10A" of another comparative example, corresponding to FIG. 2B showing the TFT 10A1.
Figure 4:
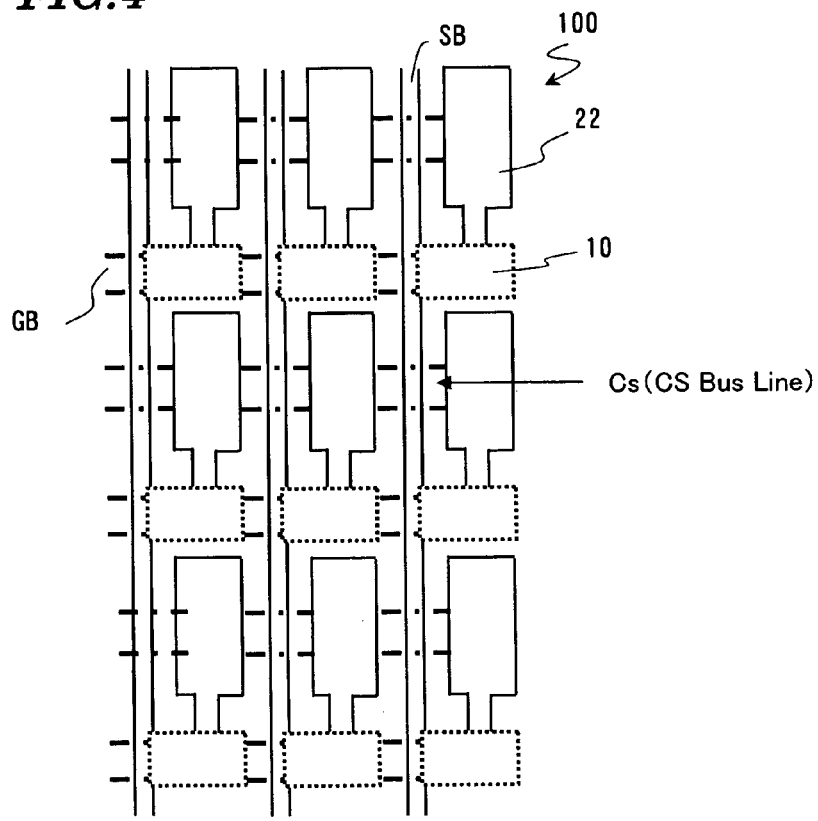
FIG. 4 is a plan view schematically showing the structure of an active matrix substrate 100 of the first embodiment.

FIG. 1A is a plan view schematically showing the structure of a TFT 10A1 included in the TFT substrate of Example 1; FIG. 1B is a plan view schematically showing the structure of a TFT 10A2 as a variant of Example 1; FIG. 1C is a plan view schematically showing the structure of a TFT 10A3 as another variant of Example 1; FIG. 1D is a plan view schematically showing the structure of a TFT 10A4 as still another variant of Example 1; and FIG. 1E is a plan view schematically showing the structure of a TFT 10A' included in a TFT substrate of Comparative Example 1. FIGS. 2A, 2B, 2C, and 2D are schematic cross-sectional views taken along lines A–A', B–B', C–C', and D–D' in FIG. 1A. FIG. 2E is a schematic cross-sectional view taken along line D–D', with respect to the case where a residual semiconductor film exists in the TFT 10A1 of Example 1. FIG. 3 is a schematic cross-sectional view showing a TFT 10A" of another comparative example, corresponding to FIG. 2B showing the TFT 10A. FIG. 4 is a plan view schematically showing the structure of an active matrix substrate 100 of the first embodiment. Any TFT other than that of Example 1 may also be employed for the active matrix substrate 100.

As shown in FIGS. 2A to 2D, the TFT 10A1 of Example 1 includes: a gate electrode 2 formed on a substrate (e.g., a glass substrate) 1; a gate insulating layer 3 covering the gate electrode 2; a semiconductor layer (i layer) 4 formed on the gate insulating layer 3; and a source electrode 6s and a drain electrode 6d formed on the semiconductor layer 4. The TFT 10A1 also includes: a source contact layer ($n^+$ layer) 5s formed between the semiconductor layer 4 and the source electrode 6s, and a drain contact layer ($n^{+\ layer}$) 5d formed between the semiconductor layer 4 and the drain electrode 6d. A protection layer 7 is formed so as to cover these layers. Note that the source contact layer 5s and the drain contact layer 5d may be omitted, and a source contact layer and a drain contact layer may instead be formed within the semiconductor layer 4. The protection layer 7 may also be omitted.

When viewed in a normal direction of the substrate 1, the TFT 10A1 includes, as shown in FIG. 1A: a first region R1 in which the gate electrode 2 (delineated by dash-dot lines) overlaps the source electrode 6s via the semiconductor layer 4 (delineated by dot lines); a second region R2 in which the gate electrode 2 overlaps the drain electrode 6d via the semiconductor layer 4; and a third region R3 in which the semiconductor layer 4 overlaps neither the gate electrode 2, the source electrode 6s, nor the drain electrode 6d. Furthermore, between a portion of the source electrode 6s lying outside the first region R1 and a portion of the third region R3 adjoining the drain electrode 6d, or between a portion of the drain electrode 6d lying outside the second region R2 and a portion of the third region R3 adjoining the source electrode 6s, a fourth region R4 is formed, which is defined as a region where the gate electrode 2 overlaps the semiconductor layer 4 but overlaps neither the source electrode 6s nor the drain electrode 6d. Furthermore, the gate electrode 2 includes: a main body (which herein lies in a part of a gate bus line GB) including portions constituting the first region R1 and the second region R2; and a protrusion 2a from the main body. The portion of the gate electrode 2 constituting the fourth region R4 includes a part of the protrusion 2a. The gate electrode 2 is formed integrally with the gate bus line GB, and the source electrode 6s is typically formed integrally with a source bus line SB. The gate insulating layer 3 is formed so as to cover substantially the entire surface of the substrate, including the gate electrode 2 and the gate bus line GB. Although the width of the main body of the gate electrode 2 is shown to be equal to the width of the gate bus line GB, the present example is not limited thereto; alternatively, the width of the main body of the gate electrode 2 may be narrower or wider than the width of the gate bus line GB. Moreover, the main body of the gate electrode 2 does not need to have a constant width. For example, the main body of the gate electrode 2 may have a narrower portion and/or a wider portion as exemplified in FIG. 1D.

Furthermore, the TFT 10A1 includes a fifth region R5 in which the gate electrode 2 overlaps neither the semiconductor layer 4, the source electrode 6s, nor the drain electrode 6d. The fifth region R5 is formed between the third region R3 and a portion of the source electrode 6s lying outside the first region R1, or between the third region R3 and a portion of the drain electrode 6d lying outside the second region R2, such that the fifth region R5 adjoins the fourth region R4. The portion of the gate electrode 2 constituting the fifth region R5 includes at least a part of the protrusion 2a.

In this example, a recess 4a is made into the semiconductor layer 4, and the fifth region R5 is created by disposing the protrusion 2a of the gate electrode 2 so as to overlap the recess 4a in the semiconductor layer 4. The recess 4a is formed in such a manner that the recess 4a has a width which is shorter than the interspace between the source electrode 6s and the drain electrode 6d and that the recess 4a is not present under the source electrode 6s or the drain electrode 6s. It is preferable that the receding depth of the recess 4a is equal to or longer than the distance between an edge of the gate electrode 2 and an edge of the portion of the semiconductor layer 4 extending beyond the said edge of the gate electrode 2.

The protrusion 2a of the gate electrode 2 is not limited to the example shown, but may be any part of the protrusion 2a shown. Furthermore, the protrusion 2a may partially overlap the semiconductor layer 4 or the source electrode 6s (or the source bus line SB) as shown, or may not have any such overlapping portions. However, it is preferable that the protrusion 2a extends beyond the far edges of the legs of the semiconductor layer 4 defining the recess 4a, in order to ensure that there is no continuous region between the source electrode 6s and the drain electrode 6d in which the gate electrode 2 is missing under the semiconductor layer 4 even if a residual semiconductor film exists in the recess 4a in the semiconductor layer 4.

The TFT 10A1 of Example 1 differs from the TFT 10A' of Comparative Example 1 shown in FIG. 1E in that the gate electrode 2 has a protrusion 2a protruding in a direction perpendicular to the direction in which the gate bus line GB extends, whereas the gate electrode 2' of the TFT 10A' is formed with the same width as the gate bus line 2. Therefore, even if a residual semiconductor film exists in the recess 4a in the semiconductor layer 4, as exemplified in the cross-sectional view of FIG. 2E, it is possible to apply a voltage to (i.e., control the potential of) the residual semiconductor layer remaining in the recess 4a by means of the protrusion 2a of the gate electrode 2, so that any leak current via such a residual semiconductor layer can be reduced.

The reason why the recess 4a in the semiconductor layer 4 is formed at all is in order to reduce the capacitance between the gate electrode 2 (or the gate bus line BG) and the semiconductor layer 4. By reducing the capacitance between the gate electrode 2 and the semiconductor layer 4, the feed-through voltage can be reduced.

Now, referring to FIG. 3, the reason why the third region R3, i.e., a region in which the semiconductor layer 4 overlaps neither the gate electrode 2, source electrode 6s, nor the drain electrode 6d, is formed is described.

FIG. 3 is a schematic cross-sectional view showing a TFT 10A" of another comparative example, corresponding to FIG. 2B showing the TFT 10A1 of Example 1. In the TFT 1A", a semiconductor layer 4' does not have any portion (which would correspond to an upper left protrusion of the gate electrode 2 of FIG. 3) extending beyond the drain electrode 6d, so that there is a region in which the drain electrode 6d overlaps the gate electrode 2 with only the gate insulating film 3 interposed therebetween. In such a structure, a leak current is likely to occur when a Low-level scanning signal is applied to the gate electrode 2. Therefore, in order to reduce this leak current in the TFT 10A1 of Example 1, the semiconductor layer 4 has a greater width than that of the gate electrode 2 (gate bus line GB) (except in the recess 4a), such that the source electrode 6s (source bus line 6d) and the drain electrode 6d overlap the gate electrode 2 (gate bus line GB) always via the semiconductor layer 4. Specifically, the source electrode 6s and the drain electrode 6d are provided in such a manner as to go through the portion of the semiconductor layer 4 extending beyond the gate electrode 2 (gate bus line GB) and only then go over the gate electrode 2, without traversing an end of the portion of the semiconductor layer 4 that overlies the gate electrode 2 (gate bus line GB).

Next, referring to FIGS. 1B and 1C, variants of Example 1 will be described.

A TFT 10A2 shown in FIG. 1B differs from the TFT 10A1 shown in FIG. 1A in that the legs of the semiconductor layer 4 defining the recess 4a protrude even farther than the far end of the protrusion 2a of the gate electrode 2. With this structure, too, as is the case with the TFT 110A, a gate voltage is applied to any semiconductor layer present between the source electrode 6s and the drain electrode 6d (including the residual film portion: third region R3), so that carriers in the semiconductor layer 4 are controlled also in this region. Thus, the leak current can be reduced.

However, in order to effectively reduce the leak current in the portions of the third region R3 adjoining the source electrode 6s and the portions of the third region 3R adjoining the drain electrode 6d, it is preferable that the protrusion 2a extends beyond the far edge of at least one of the two legs of the semiconductor layer 4 defining the recess 4a, thus to ensure that there is no continuous region between the source electrode 6s and the drain electrode 6d in which the gate electrode 2 is missing under the semiconductor layer 4 even if a residual semiconductor film exists in the recess 4a in the semiconductor layer 4.

In the TFTs 10A1 and 10A2, the fourth region R4 (i.e., a region where the gate electrode 2 overlaps the semiconductor layer 4 but overlaps neither the source electrode 6s nor the drain electrode 6d) is formed between the drain electrode 6d and a portion of the third region R3 adjoining the source electrode 6s, or between the source electrode 6s and a portion of the third region R3 adjoining the drain electrode 6d, such that at least a part of the protrusion 2a of the gate electrode 2 lies within the fourth region R4. Alternatively, as exemplified by a TFT 10A3 shown in FIG. 1C, the protrusion 2a may be located in such a position that the protrusion 2a does not include any fourth region R4.

The pattern of the semiconductor layer 4 shown in FIG. 1C exemplifies a case where no residual film of semiconductor layer is left in the patterning process. On the other hand, if any residual film exists in the recess 4a in the semiconductor layer 4, it means that a fourth region R4 is created (in which the gate electrode 2 overlaps the semiconductor layer 4 but overlaps neither the source electrode 6s nor the drain electrode 6d), whereby the aforementioned effects are obtained.

When an active matrix substrate having a multitude of TFTs is actually produced by using the pattern design shown in FIG. 1C, the resultant active matrix substrate may occasionally include both TFTs having the pattern as shown in FIG. 1C and TFTs in which the aforementioned fourth region R4 associated with a semiconductor residual film is formed, due to fluctuations in the production process. If it were absolutely certain that the resultant active matrix substrate will only contain TFTs which are precisely patterned as shown in FIG. 1C, then there would be no need for the protrusion 2a. However, as long as the likelihood of having a residual film is more than zero, it is preferable to provide the protrusion 2a for an improved production yield of the active matrix substrate.

Note that the third region R3 in which the semiconductor layer 4 overlaps neither the gate electrode 2, source electrode 6s, nor the drain electrode 6d (in particular the portion adjoining the source electrode 6s and/or the portion adjoining the drain electrode 6d) is a feature which is common to all TFTs of the first embodiment, i.e., not only Example 1 but also any subsequent Examples. On the other hand, the area in which the semiconductor layer 4 overlaps the gate electrode 2 should ideally be small, which is the reason why a recess 4a is formed alongside an edge of the semiconductor layer 4 in the TFTs of Example 1. However, as illustrated in the subsequent Examples, a recess may be provided in a corner, or may be omitted altogether, depending on the electrode positioning.

The TFTs 10A1 to 10A3 of Example 1 may be suitably employed as TFTs 10 in an active matrix substrate 100 for a liquid crystal display device as shown in FIG. 4, for example. The active matrix substrate 100 includes a substrate, the TFTs 10 formed on the substrate, source bus lines SB, gate bus lines GB, and pixel electrodes 22. As necessary, CS bus line (i.e., storage capacitor line) CS may also be provided. The interconnection between each TFT 10 and the corresponding source bus line SB and gate bus line GB is the same as described above. Each pixel electrode 22 is connected to the drain electrode of a corresponding TFT 10. However, the drain electrode does not need to be directly connected to the pixel electrode 22. In the case where two or more TFTs are employed for each pixel, the drain electrode may be connected to a capacitance which is connected to the gate of the other TFT.

It will be appreciated that the TFT of the first embodiment may be employed not only in a liquid crystal display device, but also in any other display device such as an organic EL display device. A display device may be constructed by, for example, providing a display medium layer (a liquid crystal layer or an organic EL layer, etc.) above the pixel electrodes 22, and further providing a counter electrode(s) for supplying a voltage or current to the display medium layer.

Hereinafter, other examples of the first embodiment will be described along with comparative examples. Although each of the below examples is directed to a structure including a fourth region R4 (as shown in FIG. 1A or 1B with respect to Example 1), each structure may be adapted to a type not including a fourth region R4 (exemplified in FIG. 1C), as is the case with Example 1.

Figure 5A:
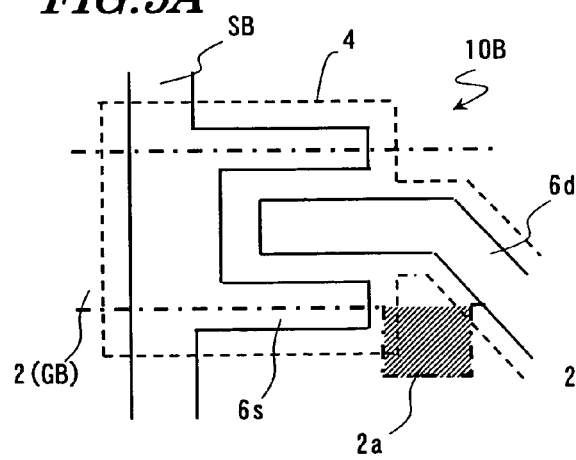
FIG. 5A is a plan view schematically showing the structure of a TFT 10B of Example 2.
Figure 5B:
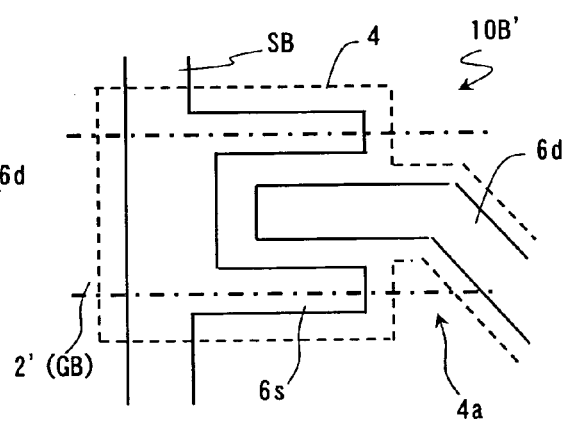
FIG. 5B is a plan view schematically showing the structure of a TFT 10B' of Comparative Example 2.

FIG. 5A is a plan view schematically showing the structure of a TFT 10B of Example 2; and FIG. 5B is a plan view schematically showing the structure of a TFT 10B' of Comparative Example 2.

In the TFT 10B of Example 2, a recess 4a is formed in a semiconductor layer 4 under a kinked drain electrode 6d. A protrusion 2a is provided for a gate electrode 2 in order to reduce the leak current in the case where a residual film is left in the recess 4a. The protrusion 2a of the gate electrode 2 is not limited to the example shown, but may be any part of the protrusion 2a shown. Furthermore, the protrusion 2a may partially overlap the semiconductor layer 4 or the source electrode 6s (or the source bus line SB) as shown, or may not have any such overlapping portions. However, it is preferable that the protrusion 2a extends beyond the far edges of the legs of the semiconductor layer 4 defining the recess 4a, in order to ensure that there is no continuous region between the source electrode 6s and the drain electrode 6d in which the gate electrode 2 is missing under the semiconductor layer 4 even if a residual semiconductor film exists in the recess 4a in the semiconductor layer 4.

Figure 6A:
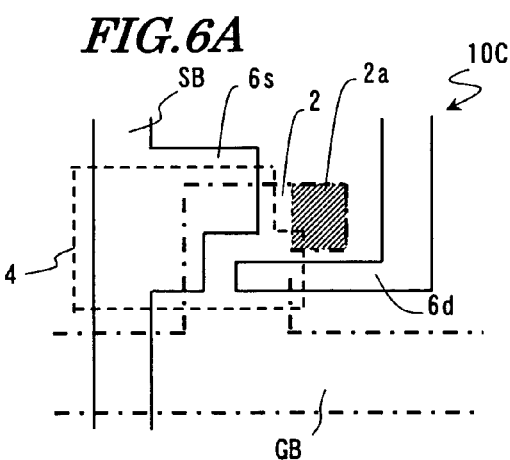
FIG. 6A is a plan view schematically showing the structure of a TFT 10C of Example 3.
Figure 6B:
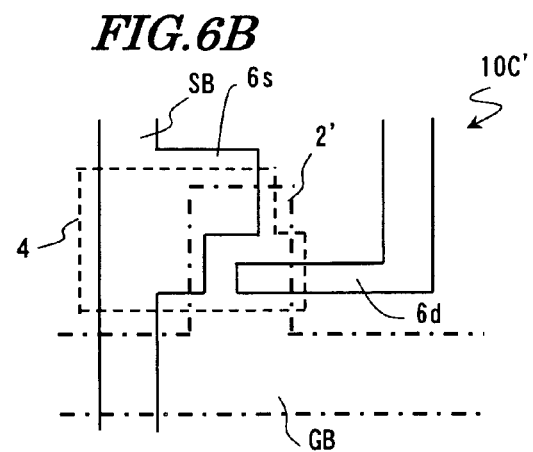
FIG. 6B is a plan view schematically showing the structure of a TFT 10C' of Comparative Example 3.

FIG. 6A is a plan view schematically showing the structure of a TFT 10C of Example 3; and FIG. 6B is a plan view schematically showing the structure of a TFT 10C' of Comparative Example 3.

In the TFT 10C of Example 3, a gate electrode 2 is formed as a branch extending from a gate bus line GB. A semiconductor layer 4 has a recessed corner (an upper right corner in FIG. 6A) in order to prevent any region which cannot be controlled by the gate electrode 2 from being continuously formed between a source electrode 6s and a drain electrode 6d, and to reduce the overlapping area with the gate electrode 2. A protrusion 2a is provided for the gate electrode 2 in order to reduce the leak current in the case where a residual film is left in the recessed corner. The protrusion 2a of the gate electrode 2 is not limited to the example shown, but may be any part of the protrusion 2a shown. Furthermore, the protrusion 2a may partially overlap the semiconductor layer 4 as shown, or may not have any such overlapping portions.

Figure 7A:
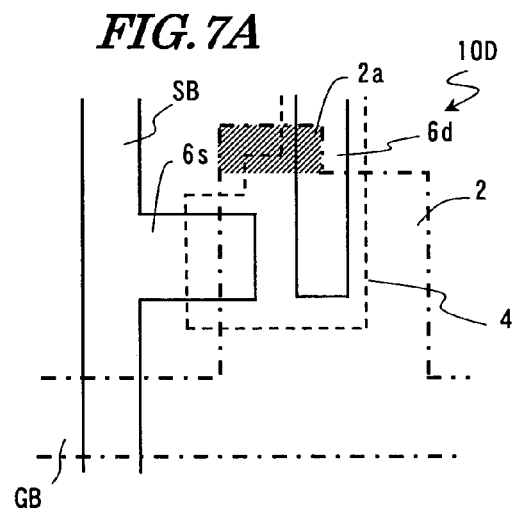
FIG. 7A is a plan view schematically showing the structure of TFT 10D of Example 4.
Figure 7B:
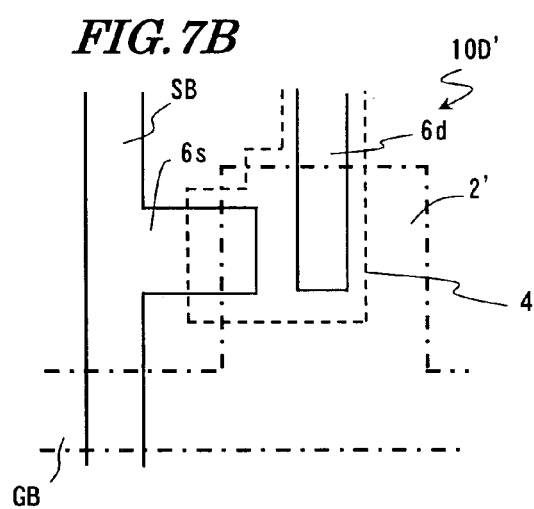
FIG. 7B is a plan view schematically showing the structure of a TFT 10D' of Comparative Example 4.

FIG. 7A is a plan view schematically showing the structure of TFT 10D of Example 4; and FIG. 7B is a plan view schematically showing the structure of a TFT 10D' of Comparative Example 4.

In the TFT 10D of Example 4, a gate electrode 2 is formed as a branch extending from a gate bus line GB. A semiconductor layer 4 has a recessed corner (an upper left corner in FIG. 7A) in order to prevent any region which cannot be controlled by the gate electrode 2 from being continuously formed between a source electrode 6s and a drain electrode 6d, and to reduce the overlapping area with the gate electrode 2. A protrusion 2a is provided for the gate electrode 2 in order to reduce the leak current in the case where a residual film is left in the recessed corner. The protrusion 2a of the gate electrode 2 is not limited to the example shown, but may be any part of the protrusion 2a shown. Furthermore, the protrusion 2a may partially overlap the semiconductor layer 4 or the drain 6d as shown, or may not have any such overlapping portions.

Figure 8A:
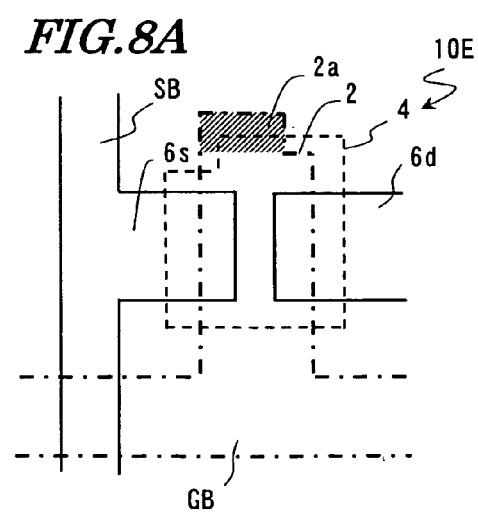
FIG. 8A is a plan view schematically showing the structure of TFT 10E of Example 5.
Figure 8B:
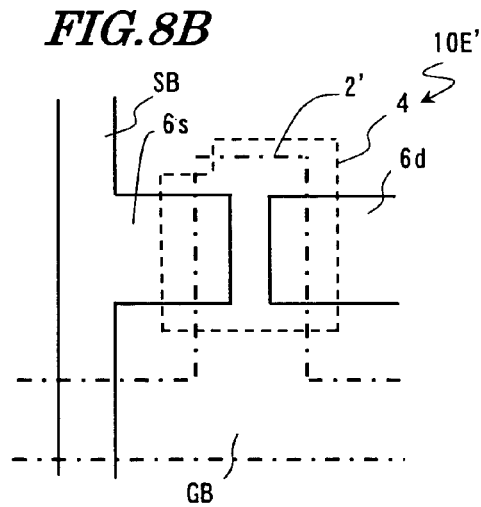
FIG. 8B is a plan view schematically showing the structure of a TFT 10E' of Comparative Example 5.

FIG. 8A is a plan view schematically showing the structure of TFT 10E of Example 5; and FIG. 8B is a plan view schematically showing the structure of a TFT 10E' of Comparative Example 5.

In the TFT 10E of Example 5, a gate electrode 2 is formed as a branch extending from a gate bus line GB. A semiconductor layer 4 has a recessed corner (an upper left corner in FIG. 8A) in order to prevent any region which cannot be controlled by the gate electrode 2 from being continuously formed between a source electrode 6s and a drain electrode 6d, and to reduce the overlapping area with the gate electrode 2. A protrusion 2a is provided for the gate electrode 2 in order to reduce the leak current in the case where a residual film is left in the recessed corner. The protrusion 2a of the gate electrode 2 is not limited to the example shown, but may be any part of the protrusion 2a shown.

Figure 9A:
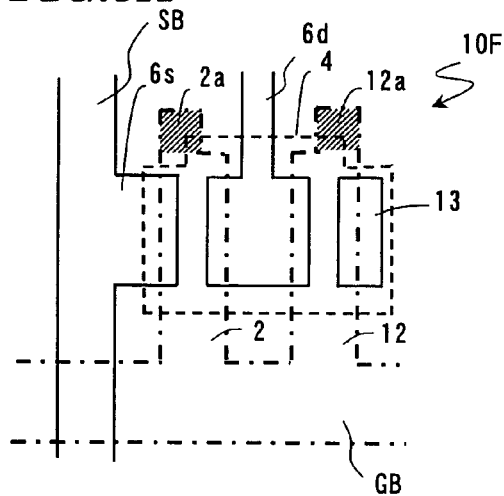
FIG. 9A is a plan view schematically showing the structure of TFT 10F of Example 6.
Figure 9B:
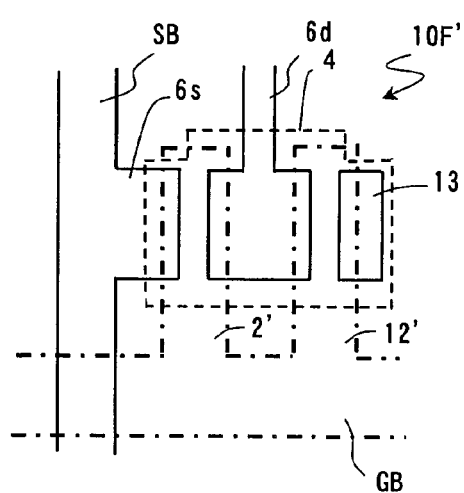
FIG. 9B is a plan view schematically showing the structure of a TFT 10F' of Comparative Example 6.

FIG. 9A is a plan view schematically showing the structure of TFT 10F of Example 6; and FIG. 9B is a plan view schematically showing the structure of a TFT 10F' of Comparative Example 6.

In the TFT 10F of Example 6, a gate electrode 2 is formed as a branch extending from a gate bus line GB. A semiconductor layer 4 has a recessed corner (an upper left corner in FIG. 9A) in order to prevent any region which cannot be controlled by the gate electrode 2 from being continuously formed between a source electrode 6s and a drain electrode 6d, and to reduce the overlapping area with the gate electrode 2. A protrusion 2a is provided for the gate electrode 2 in order to reduce the leak current in the case where a residual film is left in the recessed corner.

Furthermore, the TFT 10F includes a further electrode 13 (which is insulated from any other region), which is formed from the same conductive film as that composing the source electrode 6s and the drain electrode 6d. The TFT 10F also includes an electrode 12 which branches off from the gate bus line GB and provided correspondingly to the electrode 13 and the drain electrode 6d, in a manner similar to the gate electrode 2. The electrodes 12 and 13 are provided in order to ensure that the capacitance between the gate electrode 2 and the drain electrode 6d while the TFT is on is not affected by misalignment. In order to reduce the capacitance between the electrode 12 branching off from the gate bus line GB and the semiconductor layer 4, a recessed corner (an upper right corner in FIG. 9A) is made into the semiconductor layer 4.

If a leak current via a residual semiconductor film occurs between the electrode 13 and the drain electrode 6d, which electrodes are meant to be insulated from each other, the extra capacitance between the electrode 13 and the drain electrode 6d is added while the TFT is on, possibly causing a decrease in the charging rate of the pixel. Furthermore, a feed-through voltage which occurs at the time when a scanning signal transitions from a High level to a Low level is increased due to this capacitance component, thus deteriorating the image displaying quality. In the TFT 10F, a protrusion 12a is provided for the electrode 12 in order to reduce the leak current between the electrode 13 and the drain electrode 6d under the presence of a residual film. The protrusion 12a makes it possible to suppress a decrease in the charging rate of the pixel and an increase in the feed-through voltage.

The protrusion 2a of the gate electrode 2 and the protrusion 12a of the electrode 12 are not limited to those shown in FIG. 9A, but may be any part of the protrusions 2a and 12a as shown. However, it is preferable that the protrusion 2a and the protrusion 12a have the same size and shape. Although the electrode 12 is shown to be of the same size and shape as that of the gate electrode 2, the electrode 12 may have a different same size and shape from that of the gate electrode 2.

The above example illustrates a case where the protrusion 12a is disposed in such a manner that at least a part of the protrusion 12a overlaps a region in which the semiconductor layer 4 overlaps neither the source electrode 6s nor the drain electrode 6d. Alternatively, the protrusion 12a may be disposed in such a manner that, in the case where a residual film is left after the patterning of the semiconductor layer 4, the protrusion 12a only overlaps such a residual film. The same principle has been described with respect to the protrusion 12a of the gate electrode 2 in Example 1.

Figure 10A:
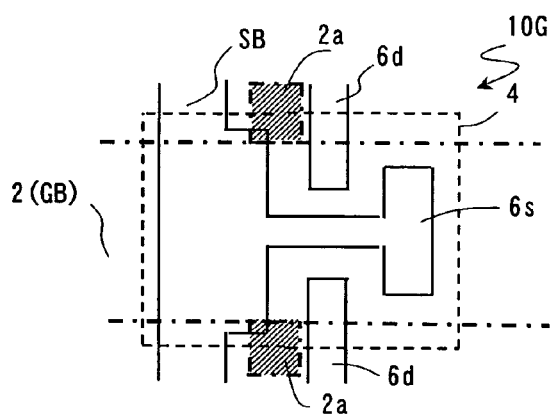
FIG. 10A is a plan view schematically showing the structure of TFT 10G of Example 7.
Figure 10B:
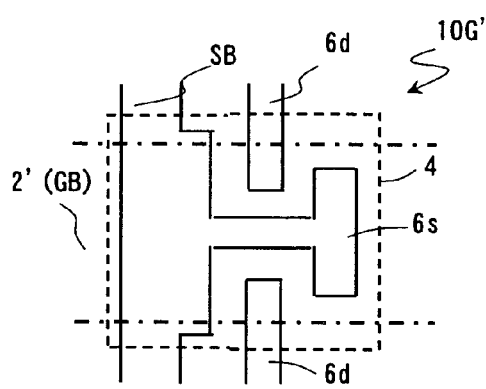
FIG. 10B is a plan view schematically showing the structure of a TFT 10G' of Comparative Example 7.

FIG. 10A is a plan view schematically showing the structure of TFT 10G of Example 7; and FIG. 10B is a plan view schematically showing the structure of a TFT 10G' of Comparative Example 7.

The TFT 10G of Example 7 comprises a gate electrode 2 whose main body lies in a part of a gate bus line GB. Although the width of the main body of the gate electrode 2 is shown to be equal to the width of the gate bus line GB, the present example is not limited thereto; alternatively, the width of the main body of the gate electrode 2 may be narrower or wider than the width of the gate bus line GB. Moreover, the main body of the gate electrode 2 does not need to have a constant width. For example, the main body of the gate electrode 2 may have a narrower portion and/or a wider portion.

Since the semiconductor layer 4 of the TFT illustrated herein does not have any recess, a leak current via the semiconductor layer present between the source bus line SB and the drain electrode 6d would occur if the structure of the TFT 10G' of Comparative Example 7 were adopted. On the other hand, by forming protrusions 2a as in the TFT 10G of Example 7, the pixel charging rate or voltage retention rate can be improved. The protrusions 2a of the gate electrode 2 may have a partial overlap with the source electrode 6s as shown, or may have no such overlapping portions.

The semiconductor layer 4 has two sides which are substantially parallel to the direction in which the gate bus line GB extends, the two sides being disposed so as to overlap the gate electrode 2 and the gate bus line GB only where the gate electrode 2 has the protrusions 2a. Although a substantially rectangular semiconductor layer 4 having two sides (which define the width of the semiconductor layer 4) that are substantially parallel to the direction in which the gate bus line GB extends, the shape of the semiconductor layer 4 is not limited thereto. The semiconductor layer 4 may have an inconstant width, and may have three or more sides which are substantially parallel to the direction in which the gate bus line GB extends, as long as those sides are disposed so as to overlap the gate electrode 2 and the gate bus line GB only where the gate electrode 2 has the protrusions 2a.

By adopting such a structure, a leak current can be prevented without providing a recess or a recessed corner in the semiconductor layer 4. The above structure is preferably adopted in the case where, as shown in FIG. 10A, there is not much interspace between the source bus line SB and the drain electrode 6d, because in such a case it is difficult to provide a recess or a recessed corner in the semiconductor layer 4. In other words, in order to be able to form a recess or a recessed corner in the semiconductor layer 4 for leak current prevention, there must be a substantial interspace between the source bus line SB and the drain electrode 6d, which may lead to an elongation of the TFT portion and possibly deteriorate the aperture ratio.

Figure 11A:
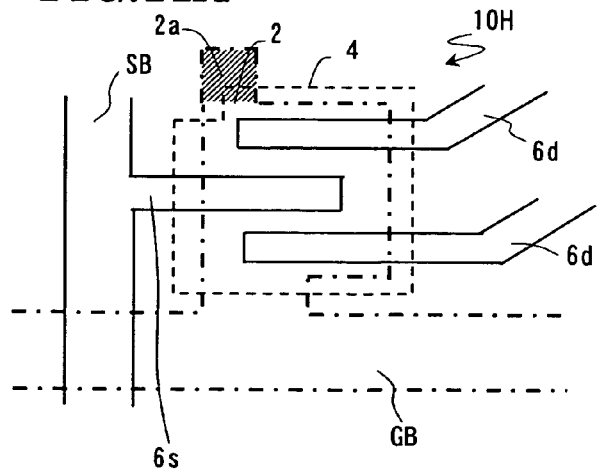
FIG. 11A is a plan view schematically showing the structure of TFT 10H of Example 8.
Figure 11B:
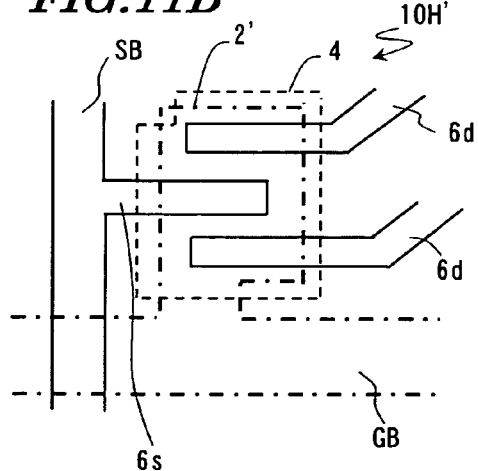
FIG. 11B is a plan view schematically showing the structure of a TFT 10H' of Comparative Example 8.

FIG. 11A is a plan view schematically showing the structure of TFT 10H of Example 8; and FIG. 11B is a plan view schematically showing the structure of a TFT 10H' of Comparative Example 8.

In the TFT 10H of Example 8, a gate electrode 2 is formed as a branch extending from a gate bus line GB. A semiconductor layer 4 has a recessed corner (an upper left corner in FIG. 11A). A protrusion 2a is provided for the gate electrode 2 in order to reduce the leak current in the case where a residual film is left in the recessed corner. The protrusion 2a of the gate electrode 2 is not limited to the example shown, but may be any part of the protrusion 2a shown. Moreover, the protrusion 2a is not limited to that which has no overlapping with the source bus line SB as shown, but may have a partial overlap therewith. Furthermore, the present example is not limited to the case where the semiconductor layer 4 is not formed under the source bus line SB as shown, but the semiconductor layer 4 may also be present under the source bus line SB. In the case where the semiconductor layer 4 is also present under the source bus line SB, the semiconductor layer 4 may partially or completely overlap the source bus line SB.

Figure 12A:
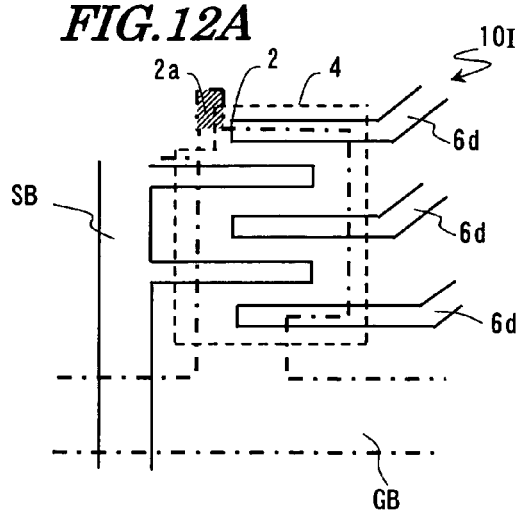
FIG. 12A is a plan view schematically showing the structure of TFT 10I of Example 9.
Figure 12B:
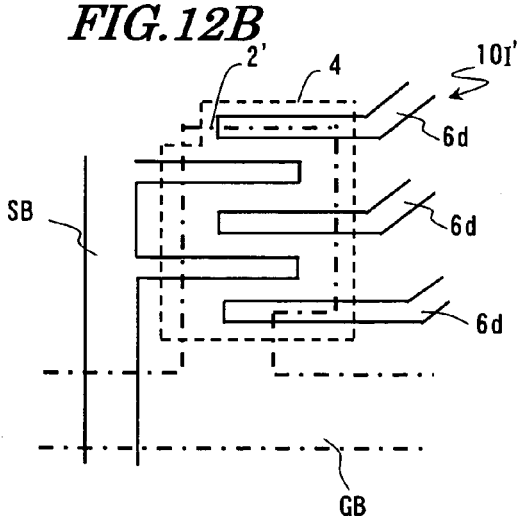
FIG. 12B is a plan view schematically showing the structure of a TFT 10I' of Comparative Example 9.

FIG. 12A is a plan view schematically showing the structure of TFT 10I of Example 9; and FIG. 12B is a plan view schematically showing the structure of a TFT 10I' of Comparative Example 9.

In the TFT 10I of Example 9, a gate electrode 2 is formed as a branch extending from a gate bus line GB. A semiconductor layer 4 has a recessed corner (an upper left corner in FIG. 12A). A protrusion 2a is provided for the gate electrode 2 in order to reduce the leak current in the case where a residual film is left in the recessed corner. The protrusion 2a of the gate electrode 2 is not limited to the example shown, but may be any part of the protrusion 2a shown. Moreover, the protrusion 2a is not limited to that which has no overlapping with the source bus line SB as shown, but may have a partial overlap therewith. Furthermore, the present example is not limited to the case where the semiconductor layer 4 is not formed under the source bus line SB as shown, but the semiconductor layer 4 may also be present under the source bus line SB. In the case where the semiconductor layer 4 is also present under the source bus line SB, the semiconductor layer 4 may partially or completely overlap the source bus line SB.

Figure 13A:
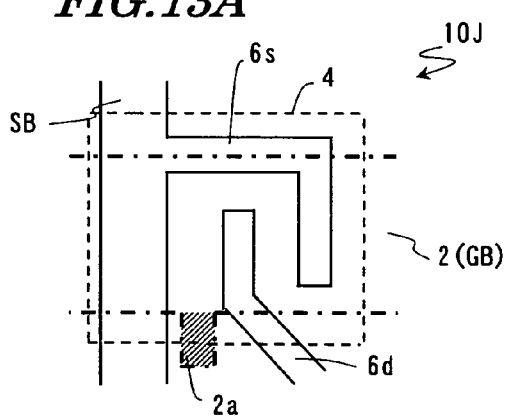
FIG. 13A is a plan view schematically showing the structure of TFT 10J of Example 10.
Figure 13B:
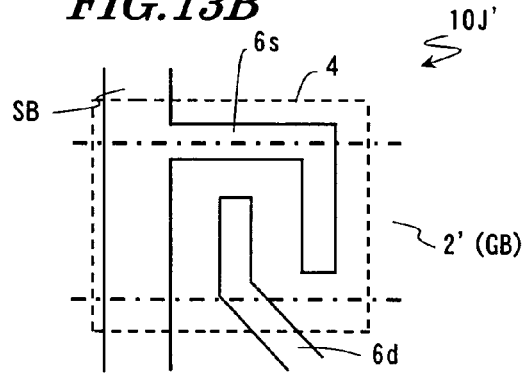
FIG. 13B is a plan view schematically showing the structure of a TFT 10J' of Comparative Example 10.

FIG. 13A is a plan view schematically showing the structure of TFT 10J of Example 10; and FIG. 13B is a plan view schematically showing the structure of a TFT 10J' of Comparative Example 10.

The TFT 10J of Example 10 comprises a gate electrode 2 whose main body lies in a part of a gate bus line GB. Although the width of the main body of the gate electrode 2 is shown to be equal to the width of the gate bus line GB, the present example is not limited thereto; alternatively, the width of the main body of the gate electrode 2 may be narrower or wider than the width of the gate bus line GB. Moreover, the main body of the gate electrode 2 does not need to have a constant width. For example, the main body of the gate electrode 2 may have a narrower portion and/or a wider portion.

Since the semiconductor layer 4 of the TFT illustrated herein does not have any recess, a leak current via the semiconductor layer present between the source bus line SB and the drain electrode 6d would occur if the structure of the TFT 10J' of Comparative Example 10 were adopted. On the other hand, by forming a protrusion 2a as in the TFT 10J of Example 10, the pixel charging rate or voltage retention rate can be improved. The protrusion 2a of the gate electrode 2 may have a partial overlap with the source electrode 6s as shown, or may have no such overlapping portion.

The semiconductor layer 4 has two sides which are substantially parallel to the direction in which the gate bus line GB extends, the two sides being disposed so as to overlap the gate electrode 2 and the gate bus line GB only where the gate electrode 2 has the protrusion 2a. Although a substantially rectangular semiconductor layer 4 having two sides (which define the width of the semiconductor layer 4) that are substantially parallel to the direction in which the gate bus line GB extends, the shape of the semiconductor layer 4 is not limited thereto. The semiconductor layer 4 may have an inconstant width, and may have three or more sides which are substantially parallel to the direction in which the gate bus line GB extends, as long as those sides are disposed so as to overlap the gate electrode 2 and the gate bus line GB only where the gate electrode 2 has the protrusion 2a.

With this structure, as in the case of the structure shown in FIG. 10A, an advantage is obtained in that a leak current can be prevented without providing a recess or a recessed corner in the semiconductor layer 4.

Figure 14A:
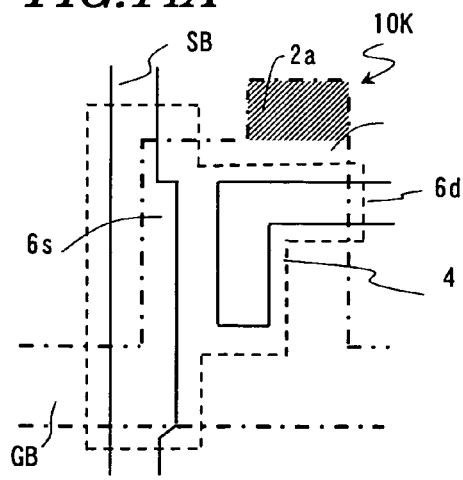
FIG. 14A is a plan view schematically showing the structure of TFT 10K of Example 11.
Figure 14B:
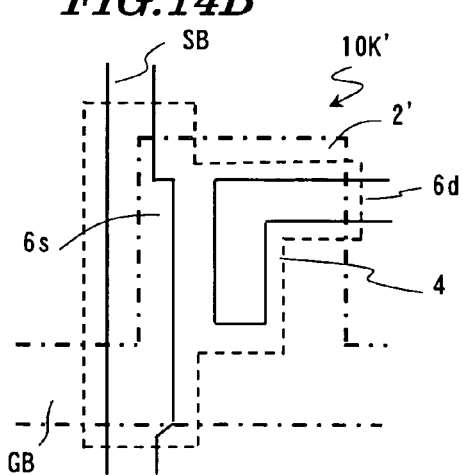
FIG. 14B is a plan view schematically showing the structure of a TFT 10K' of Comparative Example 11.

FIG. 14A is a plan view schematically showing the structure of TFT 10K of Example 11; and FIG. 14B is a plan view schematically showing the structure of a TFT 10K' of Comparative Example 11.

In the TFT 10K of Example 11, a gate electrode 2 is formed as a branch extending from a gate bus line GB. A semiconductor layer 4 has a recessed corner (an upper right corner in FIG. 14A) in order to prevent any region which cannot be controlled by the gate electrode 2 from being continuously formed between a source electrode 6s and a drain electrode 6d, and to reduce the overlapping area with the gate electrode 2. A protrusion 2a is provided for the gate electrode 2 in order to reduce the leak current in the case where a residual film is left in the recessed corner. The protrusion 2a of the gate electrode 2 is not limited to the example shown, but may be any part of the protrusion 2a shown. Furthermore, the protrusion 2a is not limited to that which has no overlapping with the semiconductor layer 4 or the drain 6d as shown, but may have a partial overlap therewith.

(Second Embodiment)

For the purpose of preventing short-circuiting between the source bus line and the gate bus line, a semiconductor layer (overlying a gate insulating layer) may in some cases be formed at an intersection between the source bus line and the gate bus line. In such a structure, if a residual semiconductor film exists which causes the portion of the semiconductor layer under the drain electrode to be connected to the portion of the semiconductor layer at the aforementioned intersection, a leak current will occur. In the present embodiment, a protrusion is provided in the gate electrode and/or the gate bus line to reduce the leak current due to such a residual semiconductor film.

FIG. 15A is a plan view schematically showing the structure of TFT 10L according to an example of the second embodiment; and FIG. 15B is a plan view schematically showing the structure of a TFT 10L' of a comparative example.

The TFT 10L comprises a gate electrode 2 whose main body lies in a part of a gate bus line GB. Although the width of the main body of the gate electrode 2 is shown to be equal to the width of the gate bus line GB, the present example is not limited thereto; alternatively, the width of the main body of the gate electrode 2 may be narrower or wider than the width of the gate bus line GB. Moreover, the main body of the gate electrode 2 does not need to have a constant width. For example, the main body of the gate electrode 2 may have a narrower portion and/or a wider portion. Furthermore, in order to prevent short-circuiting between the source bus line SB and the gate bus line GB, a semiconductor layer 14a is provided at an intersection between the source bus line SB and the gate bus line GB, so as to overlie a gate insulating layer (not shown).

A protrusion 2a is provided for the gate electrode 2 in order to reduce the leak current in the case where a residual film is left in an interspace between a semiconductor layer 4 and the semiconductor layer 14a. The protrusion 2a of the gate electrode 2 is not limited to the example shown, but may be any part of the protrusion 2a shown. Furthermore, the protrusion 2a is not limited to that which has no overlapping with the drain electrode 6d or the source bus line SB as shown, but may have a partial overlap therewith. Although FIG. 15A illustrates the semiconductor layer 4 at the intersection between the gate bus line GB and the source bus line SB as having a wider width than that of the source bus line SB, the present embodiment is not limited thereto; the aforementioned semiconductor layer 4 may conversely have a narrower width than that of the source bus line SB.

The TFT of the second embodiment may also be employed not only in a liquid crystal display device, but also in any other display device such as an organic EL display device. It will be appreciated that each of the first and second embodiments will be effective when adopted alone or adopted in combination with one another.

According to the present invention, there is provided an active matrix substrate in which a leak current is reduced even when a residual semiconductor film exists. By employing the active matrix substrate of the present invention for a liquid crystal display device, an organic EL display device, or the like, an active matrix type display device which is capable of displaying high-quality images can be obtained.

While the present invention has been described with respect to preferred embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

This non-provisional application claims priority under 35 USC §119(a) on Patent Application No. 2004-131280 filed in Japan on Apr. 27, 2004, the entire contents of which are hereby incorporated by reference.

What is claimed is:

1. An active matrix substrate comprising
a substrate and a transistor formed on the substrate, the transistor including a gate electrode, a gate insulating layer covering the gate electrode, a semiconductor layer formed on the gate insulating layer, and a source electrode and a drain electrode formed on the semiconductor layer, wherein,
when viewed in a normal direction of the substrate, the active matrix substrate includes: a first region in which the gate electrode overlaps the source electrode via the semiconductor layer; a second region in which the gate electrode overlaps the drain electrode via the semiconductor layer; and a third region in which the semiconductor layer overlaps neither the gate electrode, the source electrode, nor the drain electrode, the third region including a portion adjoining a portion of the source electrode lying outside the first region and/or a portion adjoining a portion of the drain electrode lying outside the second region;
the gate electrode includes: a main body, which includes portions constituting the first region and the second region; and a protrusion from the main body; and
at least a part of the protrusion of the gate electrode is in between the drain electrode and the portion of the third region adjoining the source electrode.

2. The active matrix substrate according to claim 1, wherein,
the active matrix substrate further includes a fourth region in which the gate electrode overlaps the semiconductor layer but overlaps neither the source electrode nor the drain electrode, the fourth region being formed between the drain electrode and the portion of the third region adjoining the source electrode, or between the source electrode and the portion of the third region adjoining the drain electrode; and
a portion of the gate electrode constituting the fourth region includes at least a part of the protrusion.

3. The active matrix substrate according to claim 1, wherein the active matrix substrate further includes a fifth region in which the gate electrode overlaps neither the semiconductor layer, the source electrode, nor the drain electrode, the fifth region being formed between the drain electrode and the portion of the third region adjoining the source electrode, or between the source electrode and the portion of the third region adjoining the drain electrode.

4. The active matrix substrate according to claim 1, wherein a portion of the gate electrode constituting the fifth region includes at least a part of the protrusion.

5. The active matrix substrate according to claim 1, wherein the semiconductor layer has a recess or a recessed corner, and the protrusion of the gate electrode has an overlap with the recess or recessed corner of the semiconductor layer.

6. The active matrix substrate according to claim 1, further comprising a gate bus line formed on the substrate, wherein the main body of the gate electrode is formed as a branch extending from the gate bus line.

7. The active matrix substrate according to claim 1, further comprising a gate bus line formed on the substrate, wherein the main body of the gate electrode lies in a part of the gate bus line.

8. An active matrix substrate comprising
a substrate and a transistor formed on the substrate, the transistor including a gate electrode, a gate insulating layer covering the gate electrode, a semiconductor layer formed on the gate insulating layer, and a source electrode and a drain electrode formed on the semiconductor layer, wherein, when viewed in a normal direction of the substrate, the active matrix substrate includes: a first region in which the gate electrode overlaps the source electrode via the semiconductor layer; a second region in which the gate electrode overlaps the drain electrode via the semiconductor layer; and a third region in which the semiconductor layer overlaps neither the gate electrode, the source electrode, nor the drain electrode, the third region including a portion adjoining a portion of the source electrode lying outside the first region and/or a portion adjoining a portion of the drain electrode lying outside the second region;

the gate electrode includes: a main body, which includes portions constituting the first region and the second region; and a protrusion from the main body;

at least a part of the protrusion of the gate electrode is in between the drain electrode and the portion of the third region adjoining the source electrode, or between the source electrode and the portion of the third region adjoining the drain electrode;

a gate bus line formed on the substrate, wherein the main body of the gate electrode lies in a part of the gate bus line; and wherein the semiconductor layer has at least two sides which are substantially parallel to a direction in which the gate bus line extends, the at least two sides being disposed so as to overlap the gate electrode and the gate bus line only at the protrusion of the gate electrode.

9. An active matrix substrate comprising a substrate and a transistor formed on the substrate, the transistor including a gate electrode, a gate insulating layer covering the gate electrode, a semiconductor layer formed on the gate insulating layer, and a source electrode and a drain electrode formed on the semiconductor layer, wherein, when viewed in a normal direction of the substrate, the active matrix substrate includes: a first region in which the gate electrode overlaps the source electrode via the semiconductor layer; a second region in which the gate electrode overlaps the drain electrode via the semiconductor layer; and a third region in which the semiconductor layer overlaps neither the gate electrode, the source electrode, nor the drain electrode, the third region including a portion adjoining a portion of the source electrode lying outside the first region and/or a portion adjoining a portion of the drain electrode lying outside the second region;

the gate electrode includes: a main body, which includes portions constituting the first region and the second region; and a protrusion from the main body;

at least a part of the protrusion of the gate electrode is in between the drain electrode and the portion of the third region adjoining the source electrode, or between the source electrode and the portion of the third region adjoining the drain electrode;

a further electrode formed from a same conductive film as that composing the source electrode and the drain electrode, wherein, when viewed in a normal direction of the substrate, the active matrix substrate includes a further second region in which the gate electrode overlaps the further electrode via the semiconductor layer;

the gate electrode has a further main body including a portion constituting the second region and the further second region; and at least a part of a further protrusion of the further electrode is in between the portion of the third region adjoining the drain electrode and a portion of the further electrode lying outside the further second region.

10. The active matrix substrate according to claim 9, wherein, the active matrix substrate includes a further fourth region in which the gate electrode overlaps the semiconductor layer but does not overlap the further electrode, the further fourth region being formed between the portion of the third region adjoining the drain electrode and the portion of the further electrode lying outside the further second region; and a portion of the gate electrode constituting the further fourth region includes at least a part of the further protrusion.

11. An active matrix substrate comprising a substrate and a transistor formed on the substrate, the transistor including a gate electrode, a gate insulating layer covering the gate electrode, a semiconductor layer formed on the gate insulating layer, and a source electrode and a drain electrode formed on the semiconductor layer, wherein, when viewed in a normal direction of the substrate, the active matrix substrate includes: a first region in which the gate electrode overlaps the source electrode via the semiconductor layer; a second region in which the gate electrode overlaps the drain electrode via the semiconductor layer; and a third region in which the semiconductor layer overlaps neither the gate electrode, the source electrode, nor the drain electrode, the third region including a portion adjoining a portion of the source electrode lying outside the first region and/or a portion adjoining a portion of the drain electrode lying outside the second region;

the gate electrode includes: a main body, which includes portions constituting the first region and the second region; and a protrusion from the main body;

at least a part of the protrusion of the gate electrode is in between the drain electrode and the portion of the third region adjoining the source electrode, or between the source electrode and the portion of the third region adjoining the drain electrode; and a source bus line connected to the source electrode, wherein the semiconductor layer overlaps at least a part of the source bus line.

12. An active matrix substrate comprising a substrate and a transistor formed on the substrate, the transistor including a gate electrode, a gate insulating layer covering the gate electrode, a semiconductor layer formed on the gate insulating layer, a source electrode and a drain electrode formed on the semiconductor layer, a gate bus line formed integrally with the gate electrode, and a source bus line connected to the source electrode, the gate bus line being covered by the gate insulating film, further comprising a further semiconductor layer formed in a region including an intersection between the gate bus line and the source bus line, the further semiconductor layer being interposed between the source bus line and the gate insulating layer, wherein, when viewed in a normal direction of the substrate, the active matrix substrate includes: a first region in which the gate electrode overlaps the source electrode via the semiconductor layer; a second region in which the gate electrode overlaps the drain electrode via the semiconductor layer; a third region in which the semiconductor layer overlaps neither the gate electrode, the source electrode, nor the drain electrode, the third region including a portion adjoining a portion of the source electrode lying outside the first region and/or a portion adjoining a portion of the drain electrode lying outside the second region; and a fourth region in which the further semiconductor layer overlaps neither the gate bus line nor the source bus line;

the gate electrode and/or the gate bus line has a protrusion protruding in a direction perpendicular to a direction in which the gate bus line extends; and at least a part of the protrusion of the gate electrode is in between the fourth region and a portion of the drain electrode lying outside the second region.

13. The active matrix substrate according to claim 12, wherein, the active matrix substrate further includes a fifth region in which the gate electrode and/or the gate bus line overlaps the semiconductor layer and/or the further semiconductor layer but overlaps neither the source electrode nor the drain electrode, the fifth region being formed between the fourth region and the portion of the drain electrode lying outside the second region; and a portion of the gate electrode and/or the gate bus line constituting the fifth region includes at least a part of the protrusion.

14. A display device comprising the active matrix substrate according to claim 1.

15. A display device comprising the active matrix substrate according to claim 12.

16. An active matrix substrate comprising a substrate and a transistor formed on the substrate, the transistor including a gate electrode extending from a gate line portion, a gate insulating layer covering the gate electrode, a semiconductor layer formed on the gate insulating layer, and a source electrode and a drain electrode formed on the semiconductor layer, wherein, when viewed in a normal direction of the substrate, the active matrix substrate includes: a first region in which the gate electrode overlaps the source electrode via the semiconductor layer; a second region in which the gate electrode overlaps the drain electrode via the semiconductor layer; and a third region in which the semiconductor layer overlaps neither the gate electrode, the source electrode, nor the drain electrode, the third region including a portion adjoining a portion of the source electrode lying outside the first region and/or a portion adjoining a portion of the drain electrode lying outside the second region;

the gate electrode includes: a main body, which includes portions constituting the first region and the second region; and a protrusion from the main body so that the main body is provided directly or indirectly between the protrusion and the gate line portion; and at least a part of the protrusion of the gate electrode is in between the drain electrode and the portion of the third region adjoining the source electrode, or between the source electrode and the portion of the third region adjoining the drain electrode.

\* \* \* \* \*